(12) United States Patent
Oki

(10) Patent No.: US 12,431,550 B2
(45) Date of Patent: Sep. 30, 2025

(54) BATTERY PACK

(71) Applicant: TOYOTA JIDOSHA KABUSHIKI KAISHA, Toyota (JP)

(72) Inventor: Atsushi Oki, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 509 days.

(21) Appl. No.: 17/955,309

(22) Filed: Sep. 28, 2022

(65) Prior Publication Data
US 2023/0104750 A1 Apr. 6, 2023

(30) Foreign Application Priority Data
Oct. 6, 2021 (JP) .................. 2021-164908

(51) Int. Cl.
*H01M 10/48* (2006.01)
*G01R 31/3835* (2019.01)
*H01M 50/204* (2021.01)
*H01M 50/262* (2021.01)

(52) U.S. Cl.
CPC ...... *H01M 10/482* (2013.01); *G01R 31/3835* (2019.01); *H01M 10/486* (2013.01); *H01M 50/204* (2021.01); *H01M 50/262* (2021.01); *H01M 2220/20* (2013.01)

(58) Field of Classification Search
CPC ............. H01M 10/482; H01M 50/262; H01M 10/486; H01M 50/204; H01M 2220/20; G01R 31/3835
See application file for complete search history.

(56) References Cited

U.S. PATENT DOCUMENTS

| | | | |
|---|---|---|---|
| 11,171,380 B2* | 11/2021 | Tajima | H01M 50/209 |
| 2014/0356657 A1* | 12/2014 | Yamamoto | H01M 10/63 429/62 |
| 2018/0366703 A1* | 12/2018 | Izumi | H01M 50/249 |

FOREIGN PATENT DOCUMENTS

| | | | |
|---|---|---|---|
| JP | 2019-117688 A | | 7/2019 |
| JP | 2019117688 | * | 7/2019 |
| JP | 2019-162895 A | | 9/2019 |
| JP | 2021072200 A | * | 5/2021 |

OTHER PUBLICATIONS

JP 2019117688 MT (Year: 2019).*
JP 2021072200 A (Year: 2021).*
The decision of JPO to grant a Patent for Application JP 2021-164908 (Year: 2024).*

* cited by examiner

*Primary Examiner* — Alexander Usyatinsky
(74) *Attorney, Agent, or Firm* — Dinsmore & Shohl LLP

(57) ABSTRACT

The battery pack includes a battery stack, a holding member, a device component, and a case. The case has opposing walls facing the device component. The holding member has a pair of fixing portions, a holding portion, and a pair of connecting portions. Holding member, when the load for deforming the opposing wall so that the opposing wall bulges toward the device component acts on the opposing wall, the device component is deformed so as to displace in a direction away from the opposing wall.

5 Claims, 4 Drawing Sheets

BATTERY PACK

CROSS-REFERENCE TO RELATED APPLICATION

This application claims priority to Japanese Patent Application No. 2021-164908 filed on Oct. 6, 2021, incorporated herein by reference in its entirety.

BACKGROUND

1. Technical Field

The present disclosure relates to a battery pack.

2. Description of Related Art

For example, Japanese Unexamined Patent Application Publication No. 2019-162895 (JP 2019-162895 A) discloses a battery pack attaching structure including a floor panel, a battery pack that is fixed to the floor panel via a fixing member, and a housing that is fixed to the floor panel via the fixing member.

SUMMARY

In the structure as described in JP 2019-162895 A, there is a case in which the device component is attached to the battery pack and the device component is covered by a case. In this case, when a load is input to the case, there is a concern that the device component is damaged by the case being is in contact with the device component.

An object of the present disclosure is to provide a battery pack capable of suppressing damage to a device component when a load is input to a case.

A battery pack according to one aspect of the present disclosure includes: a battery stack including a mounting surface; a holding member that is fixed to the mounting surface and that is able to hold a device component; the device component held in the holding member; and a case that is fixed to the battery stack and that houses the device component. The case includes an opposing wall facing the device component. The holding member includes a pair of fixing portions fixed to the mounting surface, a holding portion that holds the device component at a position spaced away from the mounting surface, and a pair of connecting portions that intersects both the pair of fixing portions and the holding portion and that connects the pair of fixing portions and the holding portion. When a load that deforms the opposing wall such that the opposing wall bulges toward the device component acts on the opposing wall, the holding member is deformed such that the device component is displaced in a direction in which the device component is spaced away from the opposing wall.

According to the present disclosure, it is possible to provide a battery pack capable of suppressing damage to a device component when a load is input to a case.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Figure 1:
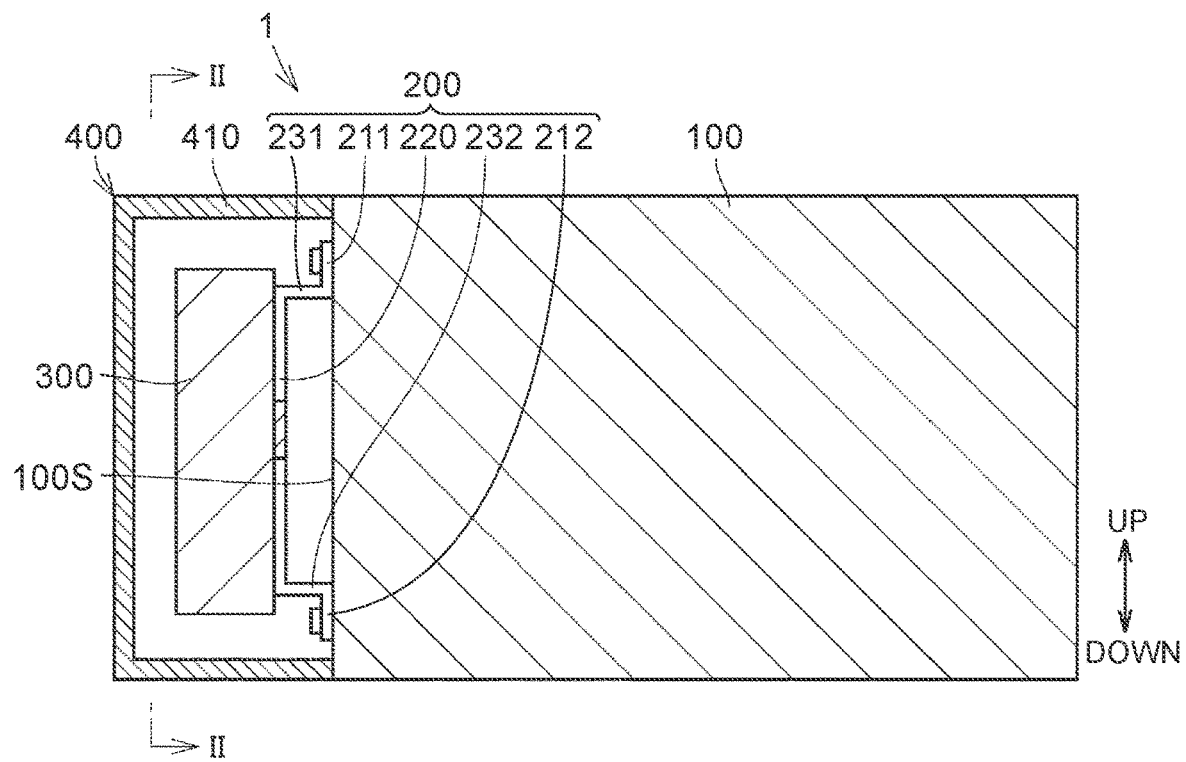
FIG. 1 is a cross-sectional view schematically showing of a battery pack of an embodiment of the present disclosure.

Embodiments of the present disclosure will be described with reference to the drawings. In the drawings referred to below, the same or corresponding members are denoted by the same reference numerals.

Figure 2:
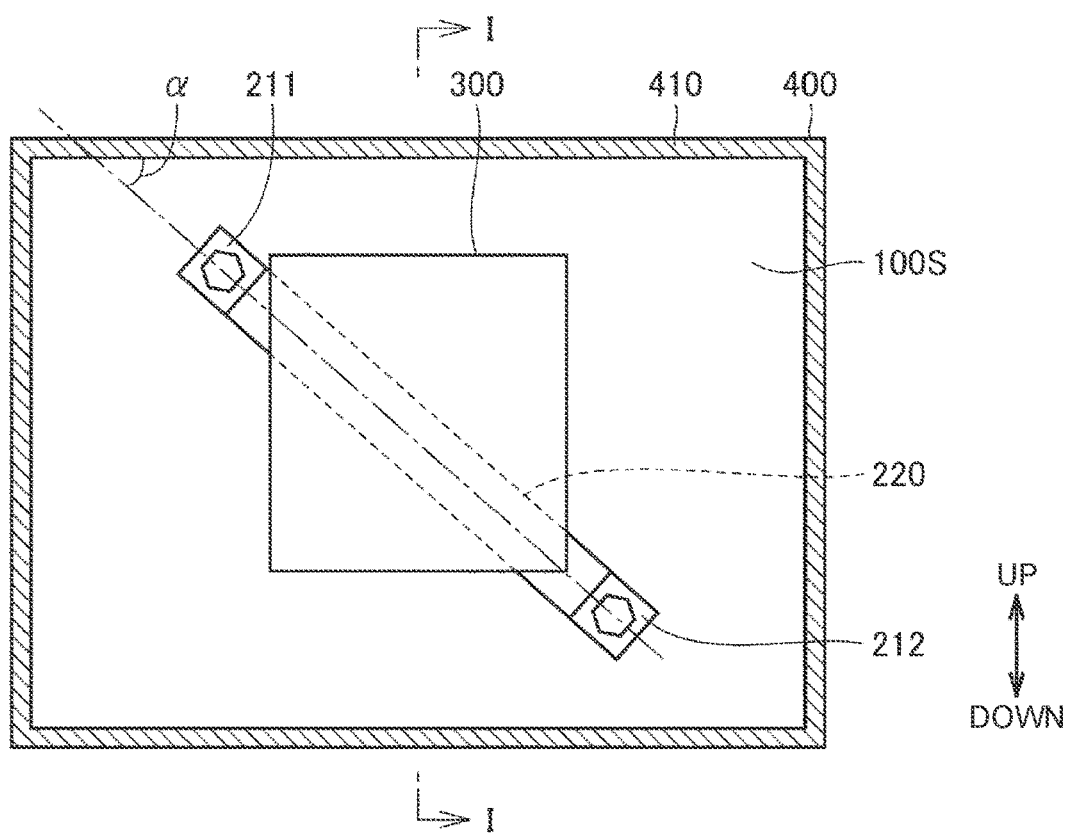
FIG. 2 is a cross-sectional view is taken along II-II line in FIG. 1.
Figure 3:
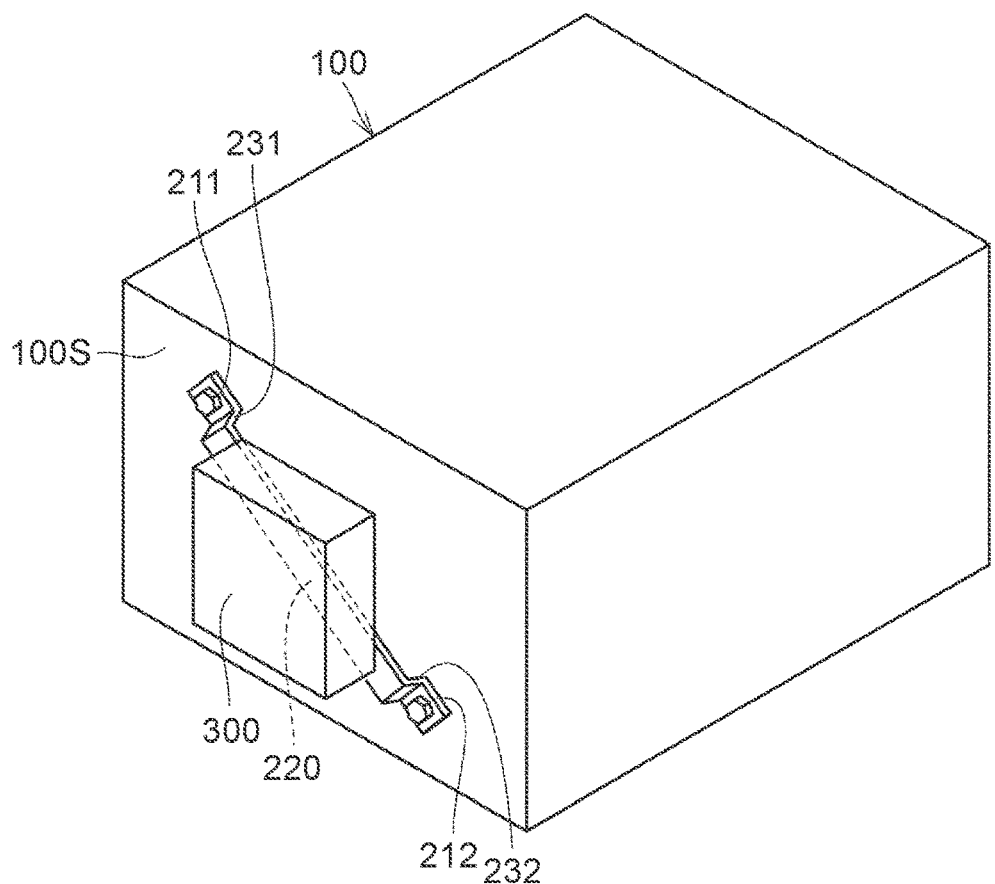
FIG. 3 is a perspective view of a battery stack, a holding member and a device component.

FIG. 1 is a perspective view schematically showing a battery pack according to an embodiment of the present disclosure. The battery pack 1 is mounted on a vehicle, for example. FIG. 2 is a cross-sectional view taken along II-II line in FIG. 1. FIG. 3 is a perspective view of the battery stack, the holding member and the device components.

As shown in FIGS. 1 to 3, the battery pack 1 includes a battery stack 100, a holding member 200, a device component 300, and a case 400.

The battery stack 100 includes a plurality of secondary batteries arranged so as to be aligned in one direction. Examples of the secondary battery include a lithium ion battery. Battery stack 100 has a substantially rectangular parallelepiped shape. The battery stack 100 has a mounting surface 100S. In the present embodiment, the mounting surface 100S is configured by a side surface of the battery stack 100. The mounting surface 100S may be formed flat.

The holding member 200 is fixed to the mounting surface 100S. The holding member 200 can hold the device component 300. The holding member 200 is made of metal, for example. The holding member 200 has a pair of fixing portions 211 and 212, a holding portion 220, and a pair of connecting portions 231 and 232.

The pair of fixing portions 211 and 212 are fixed to the mounting surface 100S by a fastening member such as a bolt, welding, or the like. The pair of fixing portions 211 and 212 has a first fixing portion 211 and a second fixing portion 212. The first fixing portion 211 is fixed to the mounting surface 100S. The second fixing portion 212 is fixed to a portion of the mounting surface 100S which is separated from the first fixing portion 211. Each of the first fixing portion 211 and the second fixing portion 212 is formed flat.

The holding portion 220 holds the device component 300 at a position separated from the mounting surface 100S. The holding portion 220 may be formed flat. The thickness of the holding portion 220 is the same as the thickness of each of the fixing portions 211 and 212.

The pair of connecting portions 231 and 232 connects the fixing portions 211 and 212 and the holding portion 220. The pair of connecting portions 231 and 232 has a first connecting portion 231 and a second connecting portion 232. The first connecting portion 231 connects the first fixing portion 211 and the holding portion 220. The second connecting portion 232 connects the second fixing portion 212 and the holding portion 220. Each connecting portion 231,232 is formed flat. The pair of connecting portions 231 and 232 intersect both of the pair of fixing portions 211 and 212 and the holding portion 220. In the present embodiment, the connecting portions 231 and 232 are orthogonal to both the fixing portions 211 and 212 and the holding portion 220. That is, the connecting portions 231 and 232 are orthogonal to the mounting surface 100S. The thickness of each of the connecting portions 231 and 232 is the same as the thickness of each of the fixing portions 211 and 212.

The device component 300 is held by the holding member 200. The device component 300 is held in the holding portion 220. As the device component 300, a monitoring unit for monitoring the voltage and temperature or the like of the battery stack 100 is exemplified.

Case 400 is fixed to the battery stack 100. Case 400 houses the device component 300. The case 400 is made of metal or the like. The case 400 has an opposing wall 410 facing the device component 300. In this embodiment, the opposing wall 410 is disposed above the device component 300. The opposing wall 410 is formed in a flat plate shape.

As shown in FIG. 2, the distance between the opposing wall 410 and the second fixing portion 212 is greater than the distance between the opposing wall 410 and the first fixing portion 211. Direction connecting the first fixing portion 211 and the second fixing portion 212 intersects the opposing wall 410. In the present embodiment, the angle α formed between the direction connecting the first fixing portion 211 and the second fixing portion 212 and the opposing wall 410 is set to a sharp angle.

Figure 4:
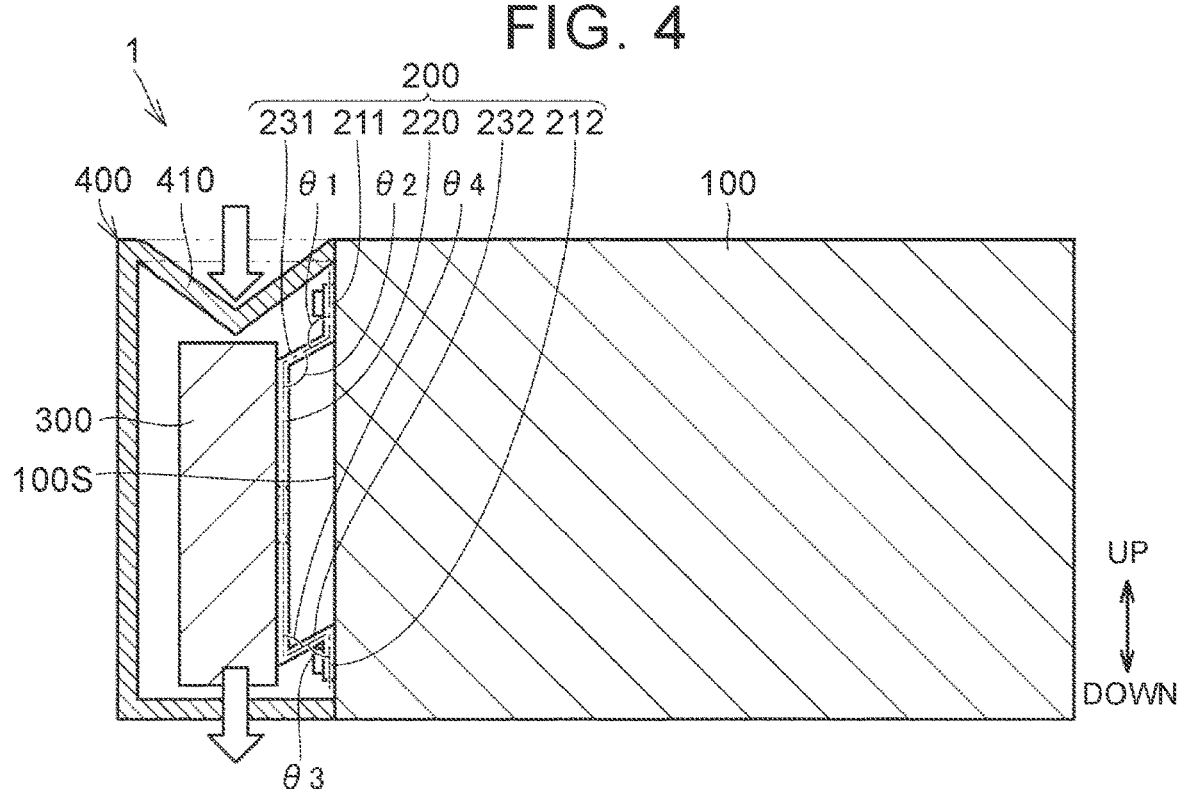
FIG. 4 is a cross-sectional view schematically showing a shape of an opposing wall and the holding member when a load is input to the opposing wall of a case.

Next, referring to FIG. 4, a case where the load is applied to the opposing wall 410. As shown in FIG. 4, when the load for deforming the opposing wall 410 so that the opposing wall 410 bulges toward the device component 300 acts on the opposing wall 410, the device component 300 is displaced in a direction away from the opposing wall 410 (downward in FIG. 4) holding member 200 is deformed so as to displace. More specifically, when the load is applied to the opposing wall 410, with the angle θ1 formed by the first connecting portion 231 and the first fixing portion 211 is larger than the angle θ1 formed by the first connecting portion 231 and the first fixing portion 211 before the load acts on the opposing wall 410, the angle θ2 formed by the first connecting portion 231 and the holding portion 220 becomes larger than the angle θ2 formed by the first connecting portion 231 and the first fixing portion 211 before the load acts on the opposing wall 410, the angle θ3 formed by the second connecting portion 232 and the second fixing portion 212 becomes smaller than the angle θ3 formed by the second connecting portion 232 and the second fixing portion 212 before the load acts on the opposing wall 410, and the angle θ4 formed by the second connecting portion 232 and the holding portion 220 becomes smaller than the angle θ4 formed by the second connecting portion 232 and the holding portion 220 before the load acts on the opposing wall 410, the holding member 200 is deformed.

Thus, the device component 300 which is held in the holding portion 220 and the holding portion 220 is displaced in a direction spaced from the opposing wall 410 (downward in this embodiment). In some embodiments, the amount of displacement of the holding portion 220 is larger than the amount of swelling of the opposing wall 410.

To realize the deformation of the holding member 200, the bending rigidity of the holding member 200 is set smaller than the bending rigidity of the opposing wall 410. More particularly, the bending rigidity of the boundary portion between the first fixing portion 211 and the first connecting portion 231, the bending rigidity of the boundary portion between the first connecting portion 231 and the holding portion 220, the second fixing portion 212 and the second connecting portion 232 bending rigidity of the boundary portion, and, the second connecting portion 232 and the holding portion 220 bending rigidity of the boundary portion is smaller than the bending rigidity of the opposing wall 410. In some embodiments, each boundary portion is set in parallel with the opposing wall 410.

As described above, in the battery pack 1 of the present embodiment, when the load for deforming the opposing wall 410 acts on the opposing wall 410, the holding member 200 so as to displace in a direction in which the device component 300 is spaced from the opposing wall 410 is deformed. Therefore, the device component 300 is suppressed from coming into contact with the opposing wall 410 and damage of the device component 300 in association thereof is suppressed.

In the above embodiment, an example is shown in which the angle formed between the direction connecting the first fixing portion 211 and the second fixing portion 212 and the opposing wall 410 is an sharp angle, the direction connecting the first fixing portion 211 and the second fixing portion 212 may be perpendicular to the opposing wall 410. That is, the holding member 200 may be fixed to the mounting surface 100S in a posture in which the direction connecting the first fixing portion 211 and the second fixing portion 212 is the vertical direction.

Figure 5:
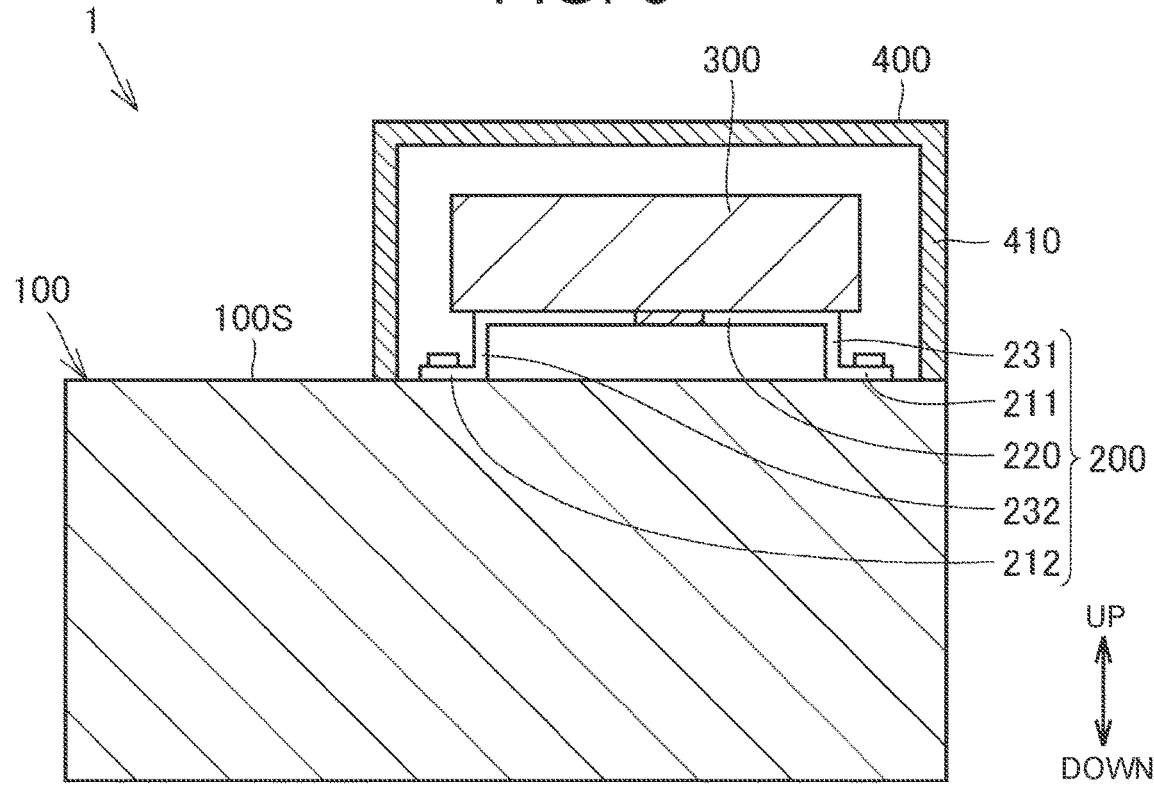
FIG. 5 is a cross-sectional view schematically showing a modification of a mounting position of the holding member and the device component with respect to the battery stack.

In addition, as shown in FIG. 5, the mounting surface 100S may be configured by an upper surface of the battery stack 100. In this case, the holding member 200 is attached to the mounting surface 100S in a manner in which the connecting portions 231 and 232 stand upright from the mounting surface 100S.

Figure 6:
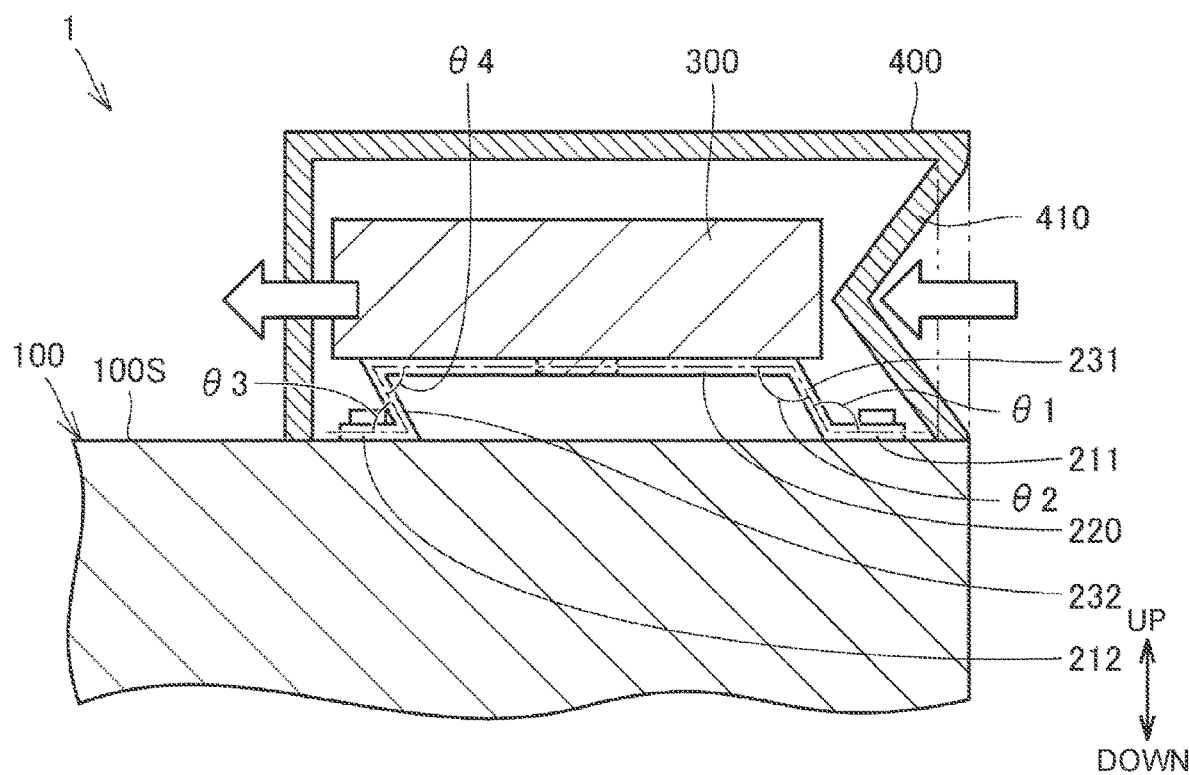
FIG. 6 is a cross-sectional view schematically showing a shape of the opposing wall and the holding member when the load is input to the opposing wall of the case.

In this embodiment, as shown in FIG. 6, when the load is applied from the side with respect to the opposing wall 410, the device component 300 is displaced in the same direction as the working direction of the load. Therefore, damage to the device component 300 is suppressed.

Next, with reference to FIGS. 7 and 8 will be described a comparative example with respect to the above embodiment.

COMPARATIVE EXAMPLE 1

Figure 7:
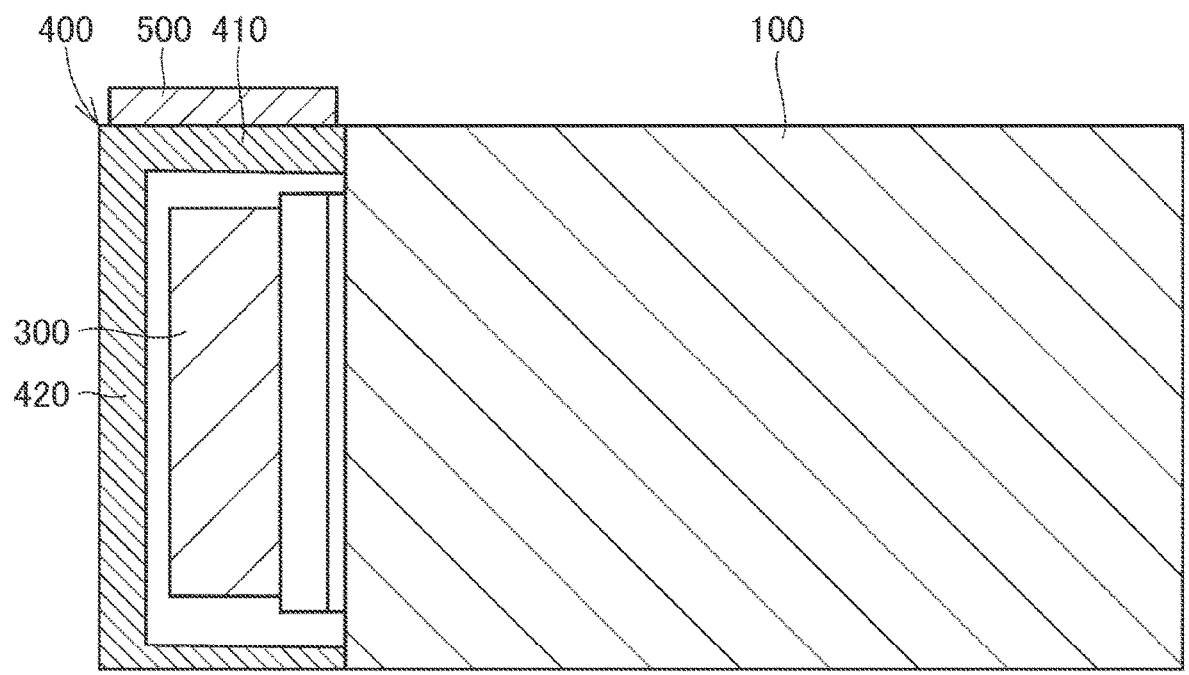
FIG. 7 is a cross-sectional view schematically shows a battery pack in a comparative example.

As shown in FIG. 7, even when the load downward with respect to the opposing wall 410 acts, or to increase the thickness of the opposing wall 410 and the side wall 420 of the case 400 to the extent that can suppress the deformation of the opposing wall 410, the upper surface of the opposing wall 410 it is conceivable to provide a reinforcing member 500. However, in this example, it is necessary to increase the size of the case 400 and to secure a space for installing the reinforcing member 500.

COMPARATIVE EXAMPLE 2

Figure 8:
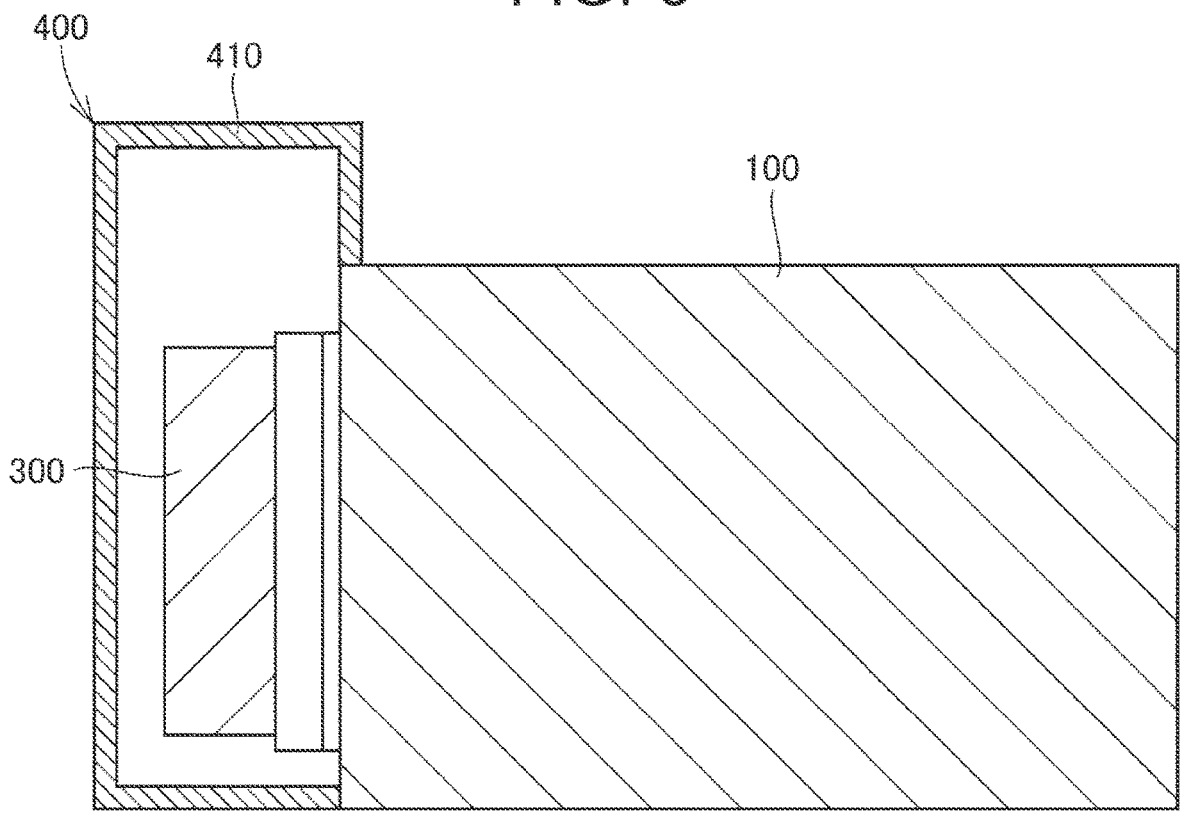
FIG. 8 is a cross-sectional view schematically showing a battery pack in a comparative example.

As shown in FIG. 8, it is contemplated to increase the distance between the opposing wall 410 and the device component 300 to ensure a space between the opposing wall 410 and the device component 300. However, in this example, it is inevitable to increase the size of the case 400.

In contrast, in the above embodiment, while avoiding the enlargement of the case 400, it is possible to suppress the damage of the device component 300 when the load is input to the case 400.

It will be understood by those skilled in the art that the exemplary embodiments described above are specific examples of the following aspects.

Battery pack in the above embodiment includes a battery stack having a mounting surface, and a holding member capable of holding the device component, and is fixed to the holding member, and a case for accommodating the device component, the case has a wall facing the device component, the holding member includes a pair of fixing portions fixed to the mounting surface, and a holding portion for holding the device component at a position spaced from the mounting surface, and intersects with both of the pair of fixing portions and the holding portion, and a pair of connecting portions for connecting the fixing portion and the holding portion, the holding member. When the load for deforming the opposing wall so as to bulge toward the device component acts on the opposing wall, the device component is deformed so as to displace in a direction away from the opposing wall.

In the battery pack, the holding member, when the load for deforming the opposing wall acts on the opposing wall, since the device component is deformed so as to displace in a direction away from the opposing wall, the opposing wall is in contact with the device component and damage of the device component associated therewith is suppressed.

The pair of fixing portions may include a first fixing portion fixed to the mounting surface, and a second fixing portion fixed to a portion of the mounting surface separated from the first fixing portion, wherein a distance between the opposing wall and the second fixing portion is larger than a distance between the opposing wall and the first fixing portion, and the pair of connecting portions may include a first connecting portion connecting the first fixing portion and the holding portion, and a second connecting portion connecting the second fixing portion and the holding portion. The holding member, when the load is applied to the opposing wall, the angle formed between the first connecting portion and the holding portion with the angle formed by the first connecting portion and the holding portion is larger than the angle formed by the first connecting portion and the first fixing portion before the load is applied to the opposing wall is greater than the angle formed between the first connecting portion and the holding portion before the load is applied to the opposing wall is greater than the angle formed between the second connecting portion and the holding portion, and the angle formed between the second connecting portion and the second fixing portion before the load is applied to the second connecting portion and the second fixing portion is applied to the opposing wall In some embodiments, the deformation may be smaller than the angle formed between the holding portion and the second connecting portion before the load is applied to the wall.

Further, the opposing wall may be disposed above the device component. In some embodiments, the direction connecting the first fixing portion and the second fixing portion intersects the opposing wall.

In this aspect, when a downward load is exerted against the opposing wall, due to the deformation of the holding member, the device component is displaced in a direction spaced away from the opposing wall, i.e., downward. Therefore, damage to the device component is suppressed.

In some embodiments, an angle formed by a direction connecting the first fixing portion and the second fixing portion and the opposing wall is an acute angle.

In this way, the length required for mounting the holding member in the vertical direction is shortened.

In some embodiments, the bending rigidity of the holding member is smaller than the bending rigidity of the opposing wall.

The device component may also include a monitoring unit for monitoring the voltage and temperature of the battery stack.

It should be noted that the embodiments disclosed this time are illustrative in all respects and should not be considered limiting. The scope of the present disclosure is indicated by the claims rather than by the description of the embodiments described above, and includes all modifications within the meaning and range equivalent to the claims.

What is claimed is:

1. A battery pack comprising:
   a battery stack including a mounting surface;
   a holding member that is fixed to the mounting surface and that is able to hold a device component;
   the device component held in the holding member; and
   a case that is fixed to the battery stack and that houses the device component, wherein:
   the case includes an opposing wall facing the device component;
   the holding member includes:
     a pair of fixing portions fixed to the mounting surface,
     a holding portion that holds the device component at a position spaced away from the mounting surface, and
     a pair of connecting portions that intersects both the pair of fixing portions and the holding portion and that connects the pair of fixing portions and the holding portion;
   when a load that deforms the opposing wall such that the opposing wall bulges toward the device component acts on the opposing wall, the holding member is deformed such that the device component is displaced in a direction in which the device component is spaced away from the opposing wall;
   the pair of fixing portions includes:
     a first fixing portion that is fixed to the mounting surface, and
     a second fixing portion that is fixed to a portion of the mounting surface spaced away from the first fixing portion;
   a distance between the opposing wall and the second fixing portion is greater than a distance between the opposing wall and the first fixing portion;
   the pair of connecting portions includes:
     a first connecting portion that connects the first fixing portion and the holding portion, and
     a second connecting portion that connects the second fixing portion and the holding portion; and
   when the load is applied to the opposing wall, the holding member is deformed such that an angle between the first connecting portion and the first fixing portion becomes larger than an angle between the first connecting portion and the first fixing portion before the load is applied to the opposing wall, an angle between the first connecting portion and the holding portion becomes larger than an angle between the first connecting portion and the holding portion before the load is applied to the opposing wall, an angle between the second connecting portion and the second fixing portion becomes smaller than an angle between the second connecting portion and the second fixing portion before the load is applied to the opposing wall, and an angle between the second connecting portion and the holding portion becomes smaller than an angle between the second connecting portion and the holding portion before the load is applied to the opposing wall.

2. The battery pack according to claim 1, wherein:
the opposing wall is disposed above the device component; and
a direction connecting the first fixing portion and the second fixing portion intersects with the opposing wall.

3. The battery pack according to claim 2, wherein an angle between the opposing wall and the direction connecting the first fixing portion and the second fixing portion is an acute angle.

4. The battery pack according to claim 1, wherein a bending rigidity of the holding member is smaller than a bending rigidity of the opposing wall.

5. The battery pack according to claim 1, wherein the device component includes a monitoring unit that monitors a voltage and a temperature of the battery stack.

\* \* \* \* \*